US005768398A

United States Patent [19]
Janse et al.

[11] Patent Number: 5,768,398
[45] Date of Patent: Jun. 16, 1998

[54] SIGNAL AMPLIFICATION SYSTEM WITH AUTOMATIC EQUALIZER

[75] Inventors: Cornelis P. Janse; Patrick A. A. Timmermans, both of Eindhoven, Netherlands

[73] Assignee: U.S. Philips Corporation, New York, N.Y.

[21] Appl. No.: 626,531

[22] Filed: Apr. 2, 1996

[30] Foreign Application Priority Data

Apr. 3, 1995 [EP] European Pat. Off. ............ 95200839

[51] Int. Cl.$^6$ ...................................................... H03G 5/00
[52] U.S. Cl. ...................... 381/103; 381/83; 381/93; 379/388; 379/410
[58] Field of Search .................... 381/103, 71, 94, 381/66, 83, 93; 379/388, 390, 410, 412

[56] References Cited

U.S. PATENT DOCUMENTS 4,783,818  11/1988  Graupe et al. ..................... 381/83
5,027,410  6/1991  Williamson et al. ................ 381/68.4
5,131,047  7/1992  Hashimoto et al. ................. 381/93
5,131,051  7/1992  Kishinaga .......................... 381/64
5,263,019  11/1993  Chu ................................. 370/32.1
5,481,615  1/1996  Eatwell et al. .................... 381/71

Primary Examiner—Forester W. Isen
Attorney, Agent, or Firm—Steven R. Biren

[57] ABSTRACT

A signal amplification system wherein a signal coming from a microphone is applied to a loudspeaker via a signal processing system. The signal processing system includes an estimator for estimating the transfer function from the loudspeaker to the microphone. The equalizer is set to a transfer function that is reciprocal to the transfer function from the loudspeaker to the microphone to equalize the transfer function from the microphone to the listeners. The estimator may include an adaptive filter which has a transfer function that approaches the transfer function from the loudspeaker to the microphone.

9 Claims, 3 Drawing Sheets

SIGNAL AMPLIFICATION SYSTEM WITH AUTOMATIC EQUALIZER

BACKGROUND OF THE INVENTION

1. Field of Invention

The invention relates to a signal amplification system comprising a pick-up element, a playback element, and a signal processing system with equalizer for deriving an output signal for the playback element from an input signal coming from the pick-up element. The invention likewise relates to a signal processing system and a method of signal amplification.

2. Description of the Related Art

A signal amplification system known in the art is described in the journal article "Ambiofonie met multiple versterkingskanalen" by S. H. de Koning and F. J van der Meulen in NAG Journaal No. 109, September 1991.

Signal amplification systems are applied, for example, in conference systems, in sound amplification systems in halls or in the open air and in hearing aids. In these systems, a signal generated by a pick-up element such as, for example, a microphone, is amplified to a desired level by an amplifier. The signal amplified thus is thereafter applied to a playback element such as, for example, a loudspeaker. A transfer function of the transmission path from the output of the playback element to a desired position in the space will generally not be the same for all frequencies. For example, the transfer function of a loudspeaker in a space often exhibits a low-pass characteristic towards the listeners, which is mostly undesired.

A solution to this problem is the use of an equalizer in the signal processing system which is set manually so that the desired transfer function from a loudspeaker to the listeners is obtained. This may be a flat transfer function, but it is likewise conceivable that a predetermined non-flat transfer function is desired. For this purpose, the signal amplification system described in the aforementioned journal article includes measuring microphones installed at the position of the listeners, to measure the transfer function.

A disadvantage of this manner of setting the equalizer is that it is impossible to take account of changes of the acoustic properties of the space. The acoustic properties of the space may change, for example, by drawing curtains or by varying the number of persons present.

SUMMARY OF THE INVENTION

It is an object of the invention to provide a signal amplification system in which the setting of the equalizer is adapted to the acoustic properties of the space.

For this purpose, the signal processing system constructed in accordance with the present invention; comprises on estimator for estimating a transfer function from the playback element to the pick-up element, and a setter for setting the equalizer transfer function in dependence on the estimated transfer function from the playback element to the pick-up element.

The invention is based on the recognition that the coarse structure of the transfer function from playback element to pick-up element hardly depends on the position of the pick-up element in the space, if assuming a substantially zero direct coupling between the playback element and the pick-up element. The coupling between the playback element and the pick-up element is then effected substantially completely by reflections in the space. Since the position of the pick-up element turns out to be unimportant, the pick-up element, used for transforming the signal to be amplified into an electric signal, is also used for estimating the coarse structure of the transfer function from the playback element to the listeners. By making the equalizer transfer function depend on the transfer function from the playback element to the pick-up element, substantially any desired transfer function from the pick-up element to the listeners can be realized. It is observed that the estimated transfer function may be a coarse amplitude transfer function, because the fin structure of the transfer function from the playback element to the pick-up element is not always relevant. Alternatively, it is possible that the equalizer is set on the basis of the transfer function from the playback element to the pick-up element including the fine structure. Finally, it is conceivable that the transfer function from the playback element to the pick-up element is determined including the fine structure and only the coarse transfer function is used for setting the equalizer.

In an embodiment of the invention the estimator for estimating the transfer function from the pick-up element to the playback element comprises an echo canceller with an adaptive filter for suppressing the transfer of the input signal of the playback element to the output of the pick-up element, and in that the signal processing system comprises a calculator for deriving the equalizer transfer function from the adaptive filter transfer function.

A suitable way of estimating a transfer function from the playback element to the pick-up element is the use of an echo canceller with an adaptive filter. A replica of the echo signal from the playback element to the pick-up element is generated by the adaptive filter, and, subsequently, this replica is subtracted from the output signal of the pick-up element. If the coefficients of the adaptive filter are converged, the adaptive filter transfer function is equal to the transfer function from the playback element to the pick-up element. The equalizer transfer function can then be calculated from the available adaptive filter transfer function. An additional advantage is that the influence of the echo path from the playback element to the pick-up element is compensated, which compensation leads to a smaller probability of occurrences of undesired oscillations, also termed acoustic feedback.

In a further embodiment of the invention the input of the signal processing system comprises a subtracter for calculating a difference signal from the output signal of the adaptive filter and the output signal of the pick-up element, in that the signal processor is arranged for deriving by an equalization filter the output signal for the playback element from the difference signal and for deriving the input signal of the adaptive filter from a signal that is representative of the input signal of the equalizer.

By deriving the adaptive filter input signal from a signal that is representative of the equalizer input signal, the setting of the equalizer is simplified. This is especially important for (simple) equalizers in which the change of a single parameter has consequences for the transfer function of all the relevant frequencies. An example of such equalizer is an octave-band equalizer with second-order sections.

The equalizer is set in such a way that the transfer function of the adaptive filter after convergence corresponds to the desired transfer function. If the transfer function of the adaptive filter after convergence does not completely correspond to the desired transfer function, corrections for the settings of the equalizer are calculated from deviations relative to this desired transfer function. In this manner, the correct setting of the equalizer is determined iteratively.

3

These and other aspects of the invention will be apparent of and elucidated with reference to the embodiments described hereinafter.

BRIEF DESCRIPTION OF THE DRAWINGS

For a fuller understanding of the invention, reference is had to the following description taken in connection with the following drawings, in which.

DESCRIPTION OF THE PREFERRED EMBODIMENTS

Figure 1:
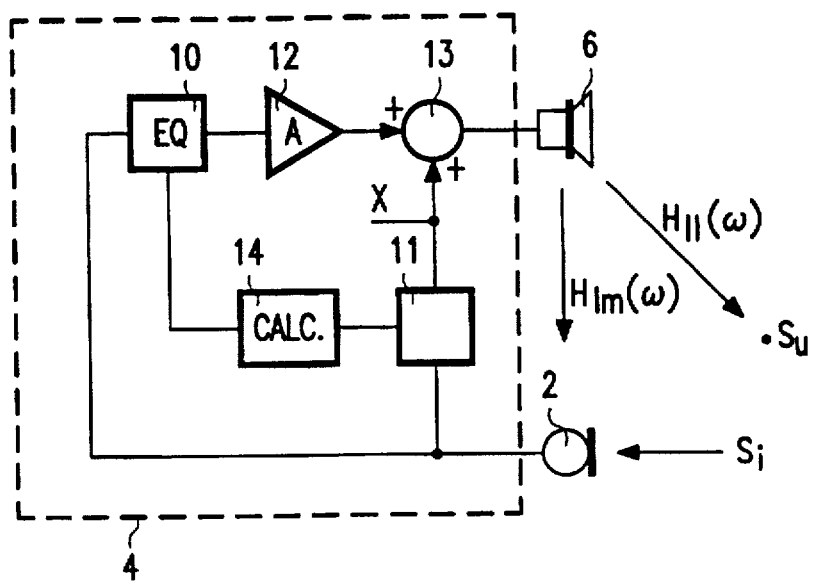
FIG. 1 shows a first embodiment of the signal amplification system according to the invention.

In the signal amplification system shown in FIG. 1, the output of the pick-up element, such as a microphone 2, is connected to an input of a signal processing system 4. The input of the signal processing system 4 is connected to a first input of an estimator 11 for estimating the transfer function from the playback element to the pick-up element. The input of the signal processing system 4 is furthermore connected to an input of an equalizer 10. An output of the equalizer 10 is connected to an input of an amplifier 12. The output of the amplifier 12 is connected to a first input of an adder circuit 13. The output of the adder circuit 13 is connected to the output of the signal processing system 4. A test signal x is applied to a second input of the adder 13 and to a second input of the estimator 11. An output of the estimator 11 is connected to an input of a calculator 14. An output of the calculator 14 is connected to an input of the equalizer 10.

The output of the signal processing system 4 is connected to an input of the playback element 6, such as a loudspeaker. The transfer function from the loudspeaker 6 to the microphone 2 is referenced $H_{lm}(\omega)$, whereas the transfer function from the loudspeaker 6 to the listeners is referenced $H_{ll}(\omega)$. The gain factor of the amplifier 12 is equal to A. $S_i$ is the acoustic input signal of the microphone 2 and $S_u$ is the acoustic signal at the position of the listeners.

The acoustic signal $S_i$ is transformed by the microphone 2 into an electric signal that is applied to the signal processing system 4. This electric signal is amplified by the signal processing system 4 to a desired level and transformed into an acoustic signal by the loudspeaker 6. For the transfer function from signal $S_i$ to signal $S_u$ there may be simply derived:

$$\frac{S_u(\omega)}{S_i(\omega)} = \frac{A \cdot H_{ll}(\omega) \cdot H_{eq}(\omega)}{1 - A \cdot H_{lm}(\omega) \cdot H_{eq}(\omega)} \quad (1)$$

If assuming that $H_{ll}(\omega)$ is equal to $k_1 \cdot H_{lm}(\omega)$ and if according to the inventive idea $H_{eq}(\omega)$ is made equal to $K_2/H_{lm}(\omega)$, (1) changes into:

$$\frac{S_u(\omega)}{S_i(\omega)} = \frac{A \cdot k_1 \cdot k_2}{1 - A \cdot k_2} \quad (2)$$

From (2) it distinctly appears that now a flat transfer function from signal $S_i$ to signal $S_u$ is obtained. The transfer function $H_{lm}(\omega)$ can be determined on the basis of the test signal x

4 and the input signal I of this signal processing system if there is no signal $S_i$. For the input signal I of the signal processing system 4, due to the presence of signal x there may be derived:

$$I(\omega) = \frac{x(\omega) \cdot H_{lm}(\omega)}{1 - A \cdot H_{lm}(\omega) \cdot H_{eq}(\omega)} \quad (3)$$

If, according to the inventive idea, the transfer function of the equalizer $H_{eq}(\omega)$ is selected equal to $k_2/H_{lm}(\omega)$, (3) changes into:

$$I(\omega) = \frac{x(\omega) \cdot H_{lm}(\omega)}{1 - A \cdot k_2} \quad (4)$$

From (4) it follows for $H_{lm}(\omega)$:

$$H_{lm}(\omega) = \frac{I(\omega) \cdot (1 - A \cdot k_2)}{x(\omega)} \quad (5)$$

If $x(\omega)$ is a signal having a flat spectrum, $H_{lm}(\omega)$ is proportional to $I(\omega)$. The spectrum of $I(\omega)$ may be calculated, for example, by performing a fast Fourier transformation.

Figure 2:
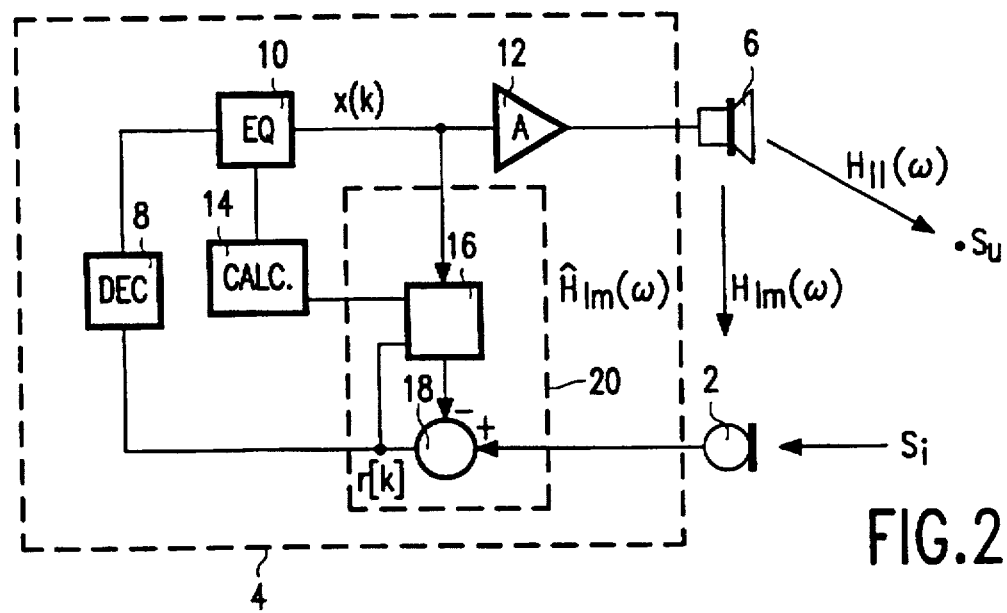
FIG. 2 shows a second embodiment of the signal amplification system according to the invention.

In the signal amplification system shown in FIG. 2, the output of the pickup element 2, such as is a microphone, is connected to an input of the signal processing system 4. The input of the signal processing system 4 is connected to a first input of an estimator 20, such as an echo canceller, for estimating the transfer function from the playback element to the pick-up element. The input of the echo canceller 20 is connected to a first input of a subtracter circuit 18. The output of the subtracter circuit 18, which also forms the output of the echo canceller 20, is connected to an input of an adaptive filter 16 and to an input of a decorrelator 8. The output of the decorrelator 8 is connected to an input of the equalizer 10. The output of the equalizer 10 is connected to the input of the amplifier 12 and to an input of the adaptive filter 16 in the echo canceller 20. The output of the amplifier 12 is connected to the output of the signal processing system 4. An output of the echo canceller 20 is connected to an input of calculator 14. An output of the calculator 14 is connected to an input of the equalizer 10.

The output of the signal processing system 4 is connected to an input of the playback element 6, which may be a loudspeaker.

The means for determining the transfer function from the playback element to the pick-up element is formed here by the echo canceller 20. In the echo canceller 20 the transfer function of the adaptive filter 16 is adapted in such a way that the correlation between the input signal of the adaptive filter 16 and the output signal of the subtracter circuit 18 is minimized. In a converged state the transfer function of the adaptive filter 16 will be substantially equal to the transfer function $H_{lm}(\omega)$. Due to the subtraction of the output signal of the adaptive filter, the echo signal developing by coupling the loudspeaker 6 to the microphone 2 will be completely removed from the output signal of the subtracter circuit 18. As a result, undesired oscillations will arise less rapidly, so that a high gain A becomes permissible.

The transfer of the equalizer 10 may now be simply determined from the transfer function of the adaptive filter 16, which, for that matter, is an estimate of the transfer function from the playback element to the pick-up element. The adder means 13 calculate the reciprocal function of the transfer function of the adaptive filter 16 and set the equalizer 10 to this reciprocal transfer function.

The decorrelator 8 reduces the correlation between the output signal of the echo canceller 20 and the input signal of the equalizer 10. The reduction of the correlation between these signals is advantageous in that undesired oscillations will not occur until a higher value of the gain A is reached, so that the value of A may be selected higher. The reduction additionally leads to improved convergence properties of the adaptive filter, because the presence of a signal $S_i$ reduces the correlation between the input signal of the adaptive filter 16 and the output signal of the subtracter circuit 18. If the decorrelator is omitted, there is always a correlation between the signal on the input of the adaptive filter 16 and the output signal of the subtracter circuit 18, which complicates the convergence of the adaptive filter 16.

The decorrelator 8 may be arranged as a variable-time phase modulator controlled by a sinusoidal auxiliary signal. Such a phase modulator is described in the journal article "Reverberation Control by Direct Feedback" by R. W. Guelke et al in Acustica, Vol. 24, 1971 pages 33–41, FIG. 13. The decorrelator 8 may also be arranged as a frequency shifter that shifts the frequency spectrum of the input signal by a slight frequency difference in many instances several Hz). Alternatively, it is possible to effect a decorrelation via a delay element whose delay varies in a more or less random fashion in response to a random control signal.

Figure 3:
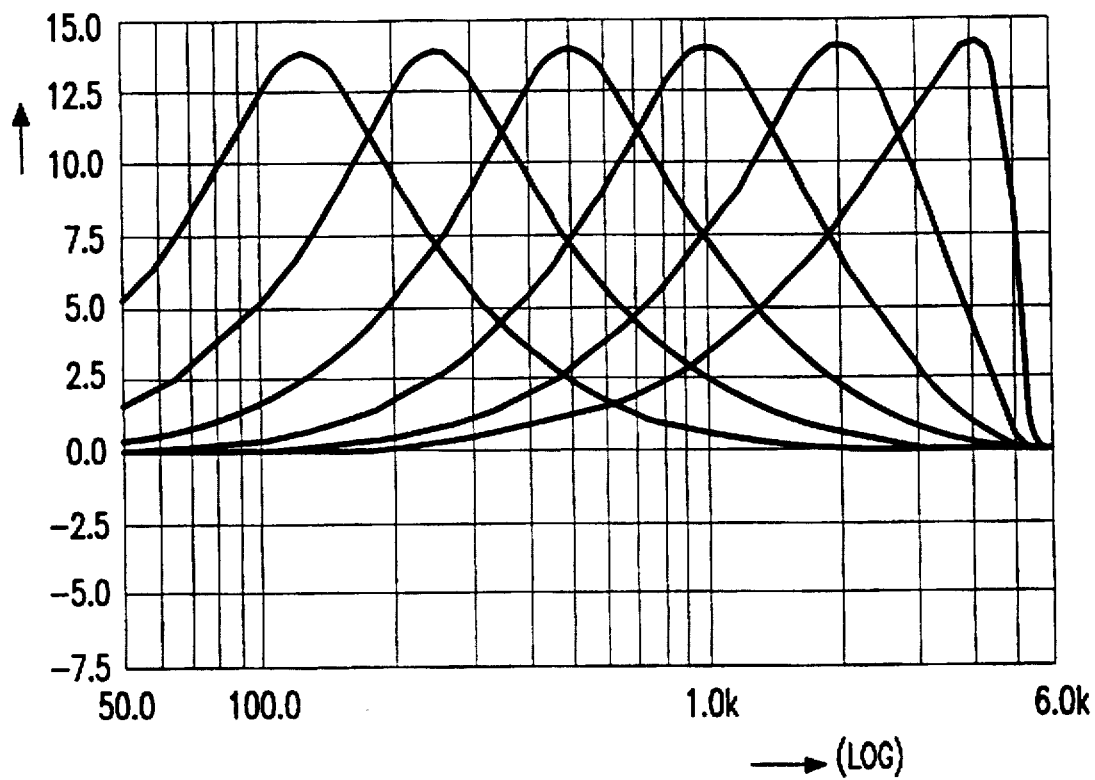
FIG. 3 shows the transfer function of the equalizer in the signal amplification system shown in FIGS. 1, 2 or 4.

A type of equalizer frequently used comprises a plurality of second-order bandpass filters whose central frequencies lie one octave apart. In FIG. 3 the transfer functions of the sections of such equalizer are shown. This equalizer contains six second-order sections. The equalizer is set by giving a correct value to the maximum value of the transfer function of the various second-order sections. The transfer functions of the digitally arranged filter sections as shown in FIG. 3 are derived from the transfer function of analog second-order bandpass filters via the bilinear transformation, while calculations are performed at a sampling rate of 11.025 kHz. The bilinear transformation is known from the description found in the reference entitled; "Discrete-Time Signal Processing" by A. W. M. van den Enden and N. A. M. Verhoeckx, ISBN 0-13-216763-8, 1989, pages 222–227. If one of the transfer functions of the filter sections is fixed, the transfer function of the equalizer may be written as:

$$H_{eq}(\omega) = F(\alpha_1, \alpha_2, \alpha_3, \alpha_4, \alpha_5, \omega) \tag{6}$$

In (6), F is generally a linear function of $\alpha_1 \ldots \alpha_5$ and a non-linear function of C. If the transfer function $\hat{H}_{lm}(\omega)$ of the adaptive filter 16 is known, the calculator can simply calculate the desired transfer $H_{eq}(\omega)$ by calculating the reciprocal value of $H_{lm}(\omega)$, normalized, as required, to the maximum value of $H_{lm}(\omega)$. The calculator 14 can calculate the parameters $\alpha_1 \ldots \alpha_5$ from the desired value $H_{eq}(\omega)$. This may be effected, for example, by specifying the value $H_{eq}(\omega)$ for five frequencies. It is then necessary to solve a set of five equations with five unknowns. Alternatively, it is possible to perform a least-square fit in which a squared error between the function $F(\alpha_1, \alpha_2, \alpha_3, \alpha_4, \alpha_5, \omega)$ and the desired function $H_{eq}(\omega)$ is minimized.

Figure 4:
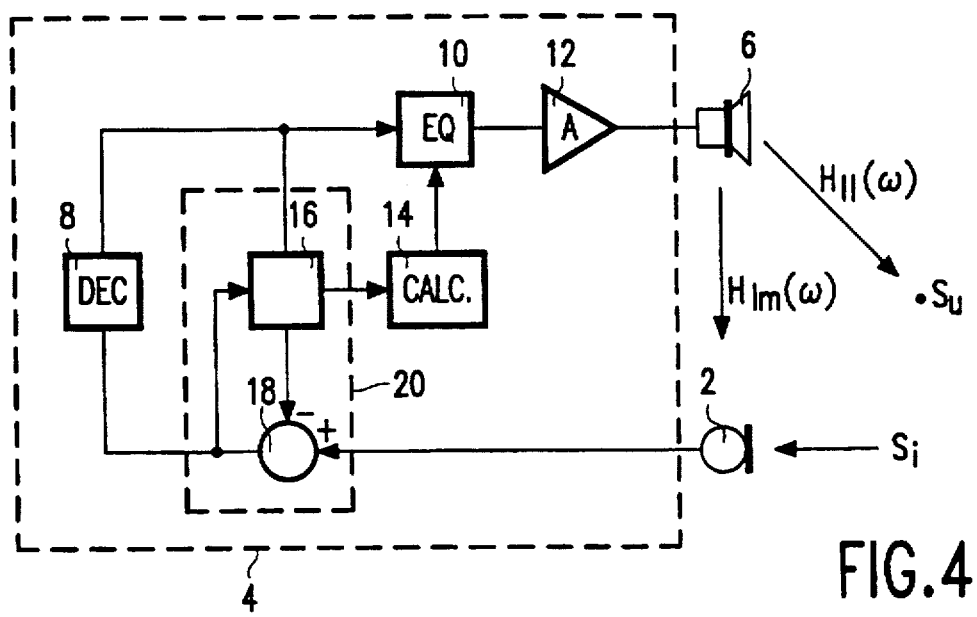
FIG. 4 shows a third embodiment of the signal amplification system according to the invention.

In the signal amplification system shown in FIG. 4, the input of the adaptive filter 16 is connected to the input of the equalizer 10 in lieu of being connected to the output of the equalizer 10 as is shown in the signal amplification system of FIG. 2. The result is that, in a converged state, the transfer function of the adaptive filter is equal to the transfer function $H_a(\omega)$ of the cascade combination of the equalizer 10 and the transmission path from the playback element 6 to the pick-up element 2.

For determining the setting of the equalizer 10 for the five angular frequencies $\omega_j$ that correspond to the resonance frequencies of the second-order sections of the equalizer 10, the mean amplitude transfer function $|H_a(\omega_j)|_{av}$ is calculated.

There may be written for this mean amplitude transfer function:

$$|H_a(\omega_j)|_{av} = \sqrt{\frac{1}{2 \cdot \Delta\omega_j} \int_{\omega_j - \Delta\omega_j}^{\omega_j + \Delta\omega_j} |H_a(\xi)|^2 d\xi} \tag{7}$$

In (7), $\omega_j$ is the resonance frequency of the $j^{th}$ second-order section of the equalizer 10, $\Delta\omega_j$ is a measure for the bandwidth of the $j^{th}$ second-order section of the equalizer 10 and $\epsilon$ is an integration variable. In addition, the mean amplitude transfer function $|H_a|_{av}$ of the equalizer 10 is calculated of the whole relevant frequency area. The following then holds:

$$|H_a|_{av} = \sqrt{\frac{1}{\omega_{max} - \omega_{min}} \int_{\omega_{min}}^{\omega_{max}} |H_a(\xi)|^2 d\xi} \tag{8}$$

The coefficients $\alpha_j$ of the equalizer 10 are then set to the value $|H_a|_{av}/|H_a(\omega_j)|_{av}$. This setting is effected always after the convergence of the adaptive filter 11. Experiments have shown that the coefficients $\alpha_i$ set in this manner converge to the desired final value.

In many instances, $H_a(\omega)$ in lieu of the transfer function will be given in the discrete frequency domain. This means that $H_a$ is known for a number of frequencies $\Theta_i$. In this situation (7) and (8) change into:

$$|H_a(j)|_{av} = \sqrt{\frac{1}{h(j) - l(j)} \sum_{i=l(j)}^{i=h(j)} |H_a(\Theta_i)|^2} \tag{9}$$

$$|H_a|_{av} = \sqrt{\frac{1}{h(j_{max}) - l(j_{min})} \sum_{i=l(j_{min})}^{i=h(j_{max})} |H_a(\Theta_i)|^2} \tag{10}$$

In (9) and (10) l(j) corresponds to the minimum cut-off frequency of the $j^{th}$ second-order section, and h(j) corresponds to the maximum cut-off frequency of the $j^{th}$ second-order section.

Alternatively, it is possible to increase or reduce the coefficient $\alpha_i$ constantly by a small value, depending on whether the value of $\alpha_i$ is already too large or too small. For the new value $\alpha_i[k]$ there may then be written:

$$\alpha_j[k] = \alpha_j[k-1] - \Delta_\alpha \cdot SGN\left(1 - \frac{|H_a|_{av}}{|H_a(j)|_{av}}\right) \tag{11}$$

Advantages of this method are both zero-value fluctuations of the coefficients of the adaptive filter if a signal $S_i$ occurs and less complexity. In addition, a more gradual adaptation of the transfer function of the equalizer 10 results in improved convergence of the adaptive filter 16, because the properties of the input signal of the adaptive filter 16 change less drastically.

An alternative way of calculating $\alpha_j[k]$ is given by:

$$\alpha_j[k] = \frac{\alpha_j[k-1]|H_a|_{av}}{\sqrt{\mu(|H_a(j)|_{av}^2 - |H_a|_{av}^2) + |H_a|_{av}^2}} \tag{12}$$

In (12) μ is an adaptation constant which may have a value around 0.1.

If the desired transfer function from the playback element 6 to the listeners is not flat, $|H_a|_{av}$ in (11) or (12) is to be replaced by a desired value $|H_a(j)|_{des}$, which value may be different for different j.

Figure 5:
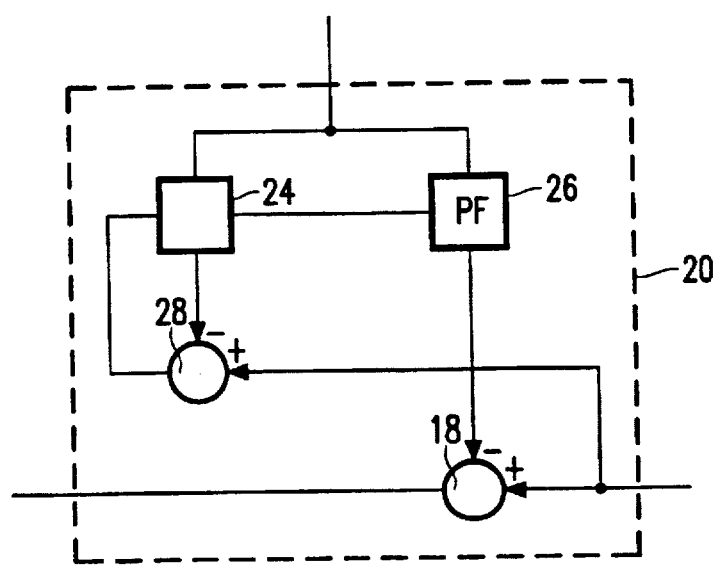
FIG. 5 shows an embodiment of the echo canceller in the signal amplification system shown in FIG. 2 or FIG. 4.

In the echo canceller 20 shown in FIG. 5, a first input is connected to an input of an adaptive filter 24 and to an input of a programmable filter 26. A second input of the echo canceller is connected to a first input of a subtracter circuit 18 and to a first input of a subtracter circuit 28. A first output of the adaptive filter 24 is connected to a second input of the subtracter circuit 28. The output of this subtracter circuit 28 is connected to a second input of the adaptive filter 24. A second output of the adaptive filter 24 carries an output signal that represents the filter coefficients for the programmable filter 26. An output of the programmable filter 26 is connected to a second input of the subtracter circuit 18. The output of the echo canceller 20 is formed by the output of the subtracter circuit 18.

The echo canceller 20 shown in FIG. 5 makes use of a combination of an adaptive filter 24 and a programmable filter 26.

The adaptive filter adapts its coefficients to minimize the output signal of the subtracter circuit 28. In addition, the adaptive filter 24 transfers its coefficients to the programmable filter 26 at regular intervals, so that the error signal on the output of the 25 subtracter circuit 18 is also minimized.

The adaptive filter 24 is usually arranged as a frequency domain filter. The use of a frequency domain filter leads to considerably improved convergence properties in input signals that have a large autocorrelation. Furthermore, the complexity of frequency domain filters for long impulse responses is considerably less than that of corresponding time domain filters. In such a frequency domain adaptive filter, the transfer function $H_a(\Theta_i)$ is available forthwith.

The programmable filter 26 is arranged as a combination of a time domain filter and a frequency domain programmable filter. The impulse response of the programmable filter 26 is subdivided into N parts, the first part being realized by a time domain filter and the other N−1 parts being realized by N−1 frequency domain filters. Such a filter is described in European Patent Application No. 639892. The advantage of such a programmable filter is the slight delay of the replica of the echo signal.

The impulse response of the programmable filter is calculated by an inverse fast Fourier transformation of the transfer function $H_a(\Theta_i)$. This impulse response is divided into a number of equal parts. The coefficients describing the first part of the impulse response are directly applied to the time domain filter. The coefficients describing the other N−1 parts of the impulse response are transformed each by a fast Fourier transformation into frequency domain coefficients and subsequently applied to the respective frequency domain filter.

We claim:

1. A signal amplification system comprising a pick-up element, a playback element, and a signal processing system with equalizer for deriving an output signal for the playback element exclusively from an input signal coming from the pick-up element, wherein the signal processing system comprises an estimator for estimating a transfer function from the playback element to the pick-up element, and setting means for automatically setting the equalizer transfer function in dependence on the estimated transfer function from the playback element to the pick-up element to obtain a desired transfer function from said pick-up element to a listener.

2. The signal amplification system as claimed in claim 1, wherein the estimator for estimating the transfer function from the pick-up element to the playback element comprises an echo canceller with an adaptive filter for suppressing the transfer of the input signal of the playback element to the output of the pick-up element, and the signal processing system comprises a calculator for deriving the equalizer transfer function from the adaptive filter transfer function.

3. The signal amplification system as claimed in claim 2, wherein the input of the signal processing system comprises a subtractor for calculating a difference signal from the output signal of the adaptive filter and the output signal of the pick-up element, in that the signal processing means are arranged for deriving by an equalization filter the output signal for the playback element from the difference signal and for deriving the input signal of the adaptive filter from a signal that is representative of the input signal of the equalizer.

4. A signal processing system with equalizer for deriving an output signal from a single input signal, wherein the signal processing system comprises an estimator for estimating a transfer function from a playback element to a pick-up element, and setting means for automatically setting a desired transfer function from said pick-up element to a listener in dependence on the estimated transfer function from the playback element to the pick-up element.

5. The signal processing system as claimed in claim 4, wherein the estimator for estimating the transfer function from the output to the input comprises an echo canceller with an adaptive filter for suppressing the transfer from the output to the input and the setting means are arranged for deriving the equalizer transfer function from the adaptive filter transfer function.

6. The signal processing system as claimed in claim 5, wherein the input of the signal processing system comprises a subtractor for calculating the difference signal from an output signal of the adaptive filter and the input signal, the signal processing means are arranged for deriving by an equalization filter the output signal for the playback element from the difference signal and for deriving the adaptive filter input signal from a signal that is representative of the equalizer input signal.

7. A method of deriving an output signal for a playback element from an input signal coming from a pick-up element exclusively while utilizing an equalizer, the method including the steps of estimating a transfer function from the playback element to the pick-up element and automatically setting the equalizer transfer function in response to the estimated transfer function from the playback element to the pick-up element to obtain a desired transfer function from said pick-up element to a listener.

8. The method as claimed in claim 7, and including the steps of suppressing the transfer of the input signal from the playback element to the output of the pick-up element by an adaptive filter and deriving the equalizer transfer function from the adaptive filter transfer function.

9. Method as claimed in claim 8, and including the steps of calculating a difference signal from an output signal of the adaptive filter and the output signal of the pick-up element, deriving the output signal for the playback element from the difference signal and deriving the input signal of the adaptive filter from a signal that is representative of the input signal of the equalizer.

* * * * *